(12) United States Patent
Staines et al.

(10) Patent No.: US 8,436,493 B2
(45) Date of Patent: May 7, 2013

(54) MICROWAVE GENERATOR

(75) Inventors: Geoffrey Staines, San Diego, CA (US); Josef Dommer, Nürnberg (DE)

(73) Assignee: Diehl BGT Defence GmbH & Co. KG, Uberlingen (DE)

( * ) Notice: Subject to any disclaimer, the term of this patent is extended or adjusted under 35 U.S.C. 154(b) by 1085 days.

(21) Appl. No.: 11/631,025

(22) PCT Filed: Jun. 8, 2005

(86) PCT No.: PCT/EP2005/006127
§ 371 (c)(1),
(2), (4) Date: Aug. 24, 2009

(87) PCT Pub. No.: WO2006/000296
PCT Pub. Date: Jan. 5, 2006

(65) Prior Publication Data
US 2009/0315406 A1  Dec. 24, 2009

(30) Foreign Application Priority Data

Jun. 29, 2004 (DE) .................. 10 2004 031 333

(51) Int. Cl.
*H02M 3/06* (2006.01)
(52) U.S. Cl.
USPC ............................... 307/109; 307/106
(58) Field of Classification Search .......... 307/106–110; 361/249, 250
See application file for complete search history.

(56) References Cited

U.S. PATENT DOCUMENTS

| | | | |
|---|---|---|---|
| 3,705,354 A | 12/1972 | Oetzel | |
| 3,748,528 A * | 7/1973 | Cronson | 315/39 |
| 5,162,972 A | 11/1992 | Gripshover et al. | |
| 5,250,773 A * | 10/1993 | Lind et al. | 219/690 |
| 5,489,818 A * | 2/1996 | Naff et al. | 315/39 |
| 6,388,579 B1 | 5/2002 | Adcox et al. | |
| 6,762,684 B1 | 7/2004 | Camhi | |
| 7,002,477 B1 | 2/2006 | Camhi | |
| 7,026,918 B2 | 4/2006 | Briick | |
| 7,574,974 B2 * | 8/2009 | Lagarde et al. | 118/723 MW |
| 7,868,273 B2 * | 1/2011 | Ganghofer et al. | 219/678 |
| 8,212,417 B2 * | 7/2012 | Urban et al. | 307/106 |
| 2003/0076044 A1 * | 4/2003 | Staines et al. | 315/39 |
| 2004/0036584 A1 | 2/2004 | Briick | |
| 2004/0066117 A1 * | 4/2004 | Staines et al. | 310/339 |
| 2004/0190214 A1 * | 9/2004 | Dommer et al. | 361/128 |
| 2004/0199785 A1 | 10/2004 | Pederson | |

(Continued)

FOREIGN PATENT DOCUMENTS

WO  2006/000296 A1  1/2006

*Primary Examiner* — Fritz M Fleming
(74) *Attorney, Agent, or Firm* — Scully, Scott, Murphy & Presser PC

(57) ABSTRACT

A microwave generator, which includes a housing having two mutually opposite electrodes which are separated via an electrode intermediate space which is filled with a dielectric, and with the electrodes having a spark gap between them, which breaks down in order to emit microwaves when a high voltage is applied. The electrode intermediate space (13, 13a, 13b) can be at least partially filled with a second dielectric (15, 15a, 15b), which has a different dielectric constant compared with that of the first dielectric (14, 14a, 14b) which is located between the electrodes (6, 7) in order to vary the microwave frequency, whereby the second dielectric (15, 15a, 15b) is held in a reservoir (17, 17a, 17b) which communicates with the electrode intermediate space (13, 13a, 13b).

15 Claims, 2 Drawing Sheets

U.S. PATENT DOCUMENTS

| | | |
|---|---|---|
| 2004/0217711 A1* | 11/2004 | Urban et al. .................. 315/3.5 |
| 2004/0263357 A1 | 12/2004 | Hamilton |
| 2005/0240324 A1 | 10/2005 | Boman et al. |
| 2006/0066148 A1 | 3/2006 | Nguyen |
| 2006/0103568 A1 | 5/2006 | Powell et al. |
| 2007/0068934 A1* | 3/2007 | Dommer et al. .............. 219/680 |
| 2008/0122363 A1* | 5/2008 | Stark et al. ................. 315/39.51 |

* cited by examiner

MICROWAVE GENERATOR

BACKGROUND OF THE INVENTION

1. Field of the Invention

The invention relates to a microwave generator, comprising a housing having two mutually opposite electrodes which are separated via an electrode intermediate space which is filled with a dielectric, and with the electrodes having a spark gap between them, which breaks down in order to emit microwaves when a high voltage is applied.

2. Discussion of the Prior Art

The operation of a microwave generator such as this is based on the short-circuiting, and thus discharging, of a high-voltage store, for example a capacitor structure, which is charged via a high-voltage supply, for example in the form of a Marx generator, via a spark gap. The short circuit results in highly oscillating discharge or short-circuit currents with a steep flank, which contain a mixture of very high frequencies which, as a rule, are emitted via an antenna as microwave energy with a broadband spectrum that is dependent on the frequency mixture. This broadband microwave spectrum has a sufficiently high energy density that the radio traffic in the area surrounding a microwave generator such as this is at least adversely affected, and input circuits of electronic circuits can be subjected to interference, or even destroyed, as a result of resonance effects.

The emission of the microwaves is based on a discharge-dependent resonance affect. The triggering electrodes between which the spark gap is formed are associated with further resonating electrode or conductor structures in which the discharge current pulse that is produced by the flashover leads to powerful sudden oscillations whose frequency mixture is a resonant peak based on the instantaneous electrically effective geometry of the resonator or of the resonator structure.

In one known embodiment of a microwave generator of the type mentioned initially, the two triggering electrodes, which are arranged coaxially, of the spark gap are connected to large-area electrodes which are in the form of spherical caps and form the antenna, with their curvatures facing one another. The two flat electrodes or antenna electrodes enclose an intermediate space between them, which is bounded at the side by the generator housing and in which a dielectric, generally a gaseous or liquid dielectric, is provided. This dielectric governs the capacitance and thus the resonant frequency of the antenna electrode structure and, in this way, the emitted frequency or the frequency spectrum of the high-power microwaves. As a result of the capacitively invariant design of the resonator structure comprising the antenna electrodes, this frequency spectrum cannot be varied.

SUMMARY OF THE INVENTION

The invention is based on the problem of specifying a microwave generator in which it is possible to vary the frequency spectrum of the emitted microwave pulses.

In order to solve this problem for a microwave generator of the type mentioned initially, the invention provides that the electrode intermediate space can be at least partially filled with a second dielectric, which has a different dielectric constant to that of the first dielectric which is located between the electrodes in order to vary the microwave frequency, which second dielectric is held in a reservoir which communicates with the electrode intermediate space.

In the microwave generator according to the invention, the effective capacitance between the electrodes which form the antenna resonator can be varied by deliberately changing the dielectric, which influences the capacitance, in the electrode intermediate space, at the same time allowing the resonant frequency and, via this in the end, the microwave frequency, to be varied and set in order to be matched as required to the characteristics of the object which is intended to be subjected to interference by or to be destroyed by the microwaves. For this purpose, a reservoir is provided on the generator side, with a second dielectric which has a different dielectric constant to that of the dielectric which was originally located in the electrode intermediate space. By way of example, a gaseous dielectric, for example $SF_6$, is initially located in the electrode intermediate space, with water being located in the reservoir as the second dielectric. This water can now be fed when required out of the reservoir into the electrode intermediate space via a connecting line which leads into it, so that this electrode intermediate space can be partially or completely filled with the substitute dielectric in which case, of course, any filling level between 0 and 100% can be selected by variation of the capacitance as a function of the amount, and thus variation of the emission response. The microwave generator according to the invention thus allows continuous frequency mixing between two end states which are respectively defined by approximately 100% filling with one dielectric or the other.

In addition to the reservoir for the second dielectric, one development of the invention also provides a further reservoir for the first dielectric, so that the first and the second dielectrics can be fed reversibly into the electrode intermediate space, that is to say one or the other can be pumped into the electrode intermediate space as required, replacing one another.

Repeated variation with multiple use of the microwave generator is thus possible without any problems.

Finally, the electrodes may have any desired shape, for example being in the form of flat disks or being hollow-cylindrical. However, it is expedient for them to be in the form of spherical caps and to be connected to the housing at the edge, bounding the electrode intermediate space. This makes it possible to form a compact resonator which nevertheless has a resonance behavior which can be used for this purpose.

One particularly advantageous refinement of the invention provides that a flexible stretchable membrane, which bounds the electrode intermediate space towards the housing, is provided and stretches into the electrode intermediate space when pressure is applied. This membrane which, if the resonator is coaxial and rotationally symmetrical, is in the form of an annular collar, on the one hand ensures that it can stretch such that the electrode intermediate space can be approximately completely filled with the second dielectric, with the membrane being sufficiently flexible that it can be stretched into all of the areas and corners of the electrode intermediate space, provided that the pressure used to deform it is sufficiently high. Furthermore, this ensures that, when the second dielectric, for example water, is extracted, it is also fed completely out of the electrode intermediate space, without the electrodes themselves being wetted, and with the membrane relaxing into its initial position, in which it makes close contact with the housing wall.

Although there are various design options with regard to the resonator, that is to say with regard to the antenna electrodes and their geometry, one advantageous refinement, as described, provides that the membrane runs in an annular shape along the housing inner wall and, when pressure is applied, is stretched uniformly into the electrode intermediate space towards the encapsulated, centrally arranged spark gap. This ensures that, when pressure (pressure or suction) is applied, that is to say when the aim is to supply the second dielectric, the membrane is stretched symmetrically over the circumference from the outside inwards, that is to say this results in a uniform change at all points. This ensures a homogenous capacitance change over the entire electrode or resonator area, which results in a homogenous variation in the resonant frequency, and thus in the microwave frequency.

In order to allow the first dielectric, for example an insulating gas, to be extracted from the electrode intermediate space, it is expedient to provide at least one opening for this purpose on one electrode for extraction and—if reversible supply is intended—for supply of the insulating gas. This opening is expediently located in an electrode area which, by virtue of the design, is only the last to be covered by the membrane, if at all, and which may also be sealed.

In order to design the microwave generator to be as compact as possible, it is advantageous to provide the reservoir for the second dielectric immediately behind one of the electrodes, bounded by it. This means that the coaxial design of the generator is also continued in the arrangement of this resonator. In this case, in order to simplify the feeding process, it is also possible to provide a membrane which bounds the reservoir, reduces the size of the reservoir when pressure is applied, and in the process forces the second dielectric out and into the electrode intermediate space, pressing it into and against the membrane which is located there. The membranes themselves are expediently composed of a flexible plastic which can stretch, particularly rubber.

Various feed options are possible for the replacement of the dielectric. On the one hand, it is possible for the second dielectric to be fed into the electrode intermediate space by production of a reduced pressure in the electrode intermediate space, by extraction of the first dielectric by means of a pump device. By way of example, the insulating gas located therein is thus sucked out, as a result of which the membrane is drawn by the existence of the reduced pressure into the electrode intermediate space, and with it the second dielectric which is located in the reservoir, possibly assisted by the further membrane, which was stressed when the reservoir was full but has now relaxed. Alternatively, it is also feasible for a pump pressure to be applied to the further membrane from the outside, and thus for the second dielectric to be pressed against the first membrane and thus into the electrode intermediate space, so that the first dielectric located therein is forced out of the electrode intermediate space, possibly controlled by a valve or the like. It is, of course, also feasible for both processes to be actuated simultaneously, that is to say to use the pump device on the one hand for suction and on the other hand to actively reduce the size of the reservoir. In this case, it is feasible to use the first dielectric, which has been pumped around by the pump device and may likewise be connected to a reservoir, to apply pressure to the further membrane in the reservoir.

As described, the microwave generator according to the invention allows variation of the capacitance, and as a consequence of this, of the resonant frequency and emission frequency, resulting from replacement of the dielectric. In this case, it is possible to feed the second dielectric into the electrode intermediate space while microwaves are being produced, that is to say it is possible to actively tune the frequency during microwave production operation. The broadband frequency spectrum is thus varied from one microwave pulse to the next. In this case, it is possible to control the supply of the second dielectric as a function of a comparison of a nominal frequency (or corresponding frequency spectra) with the actual frequency which is measured continuously while microwaves are being produced. For example, if a specific frequency spectrum is required for the object that is to be subjected to interference, then the generator can be controlled such that—starting from the basic state—the production of microwaves is initiated, but the replacement of the dielectric also takes place at the same time, to be precise until the desired nominal spectrum has been set.

BRIEF DESCRIPTION OF THE DRAWINGS

Further advantages, features and details of the invention will become evident from the exemplary embodiments described in the following text and from the drawings, in which.

DETAILED DESCRIPTION OF THE INVENTION

Figure 1:
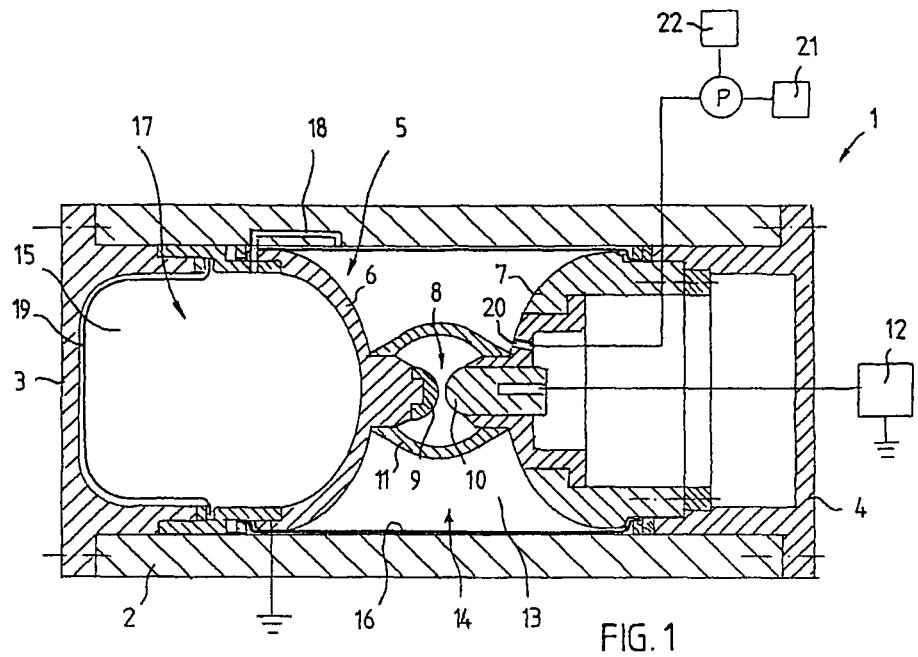
FIG. 1 shows an outline illustration of a first embodiment of a microwave generator according to the invention, in the form of a section.

FIG. 1 shows a microwave generator 1 according to the invention in the form of an outline illustration. This comprises an insulating housing 2, which is closed at both ends by closure covers 3, 4. A resonator 5 is formed in the interior, comprising two electrodes 6, 7 which are arranged opposite one another and in the illustrated exemplary embodiment are in the form of spherical caps. A spark gap 8 is provided centrally, comprising two triggering electrodes 9, 10 which are separated from one another and are accommodated encapsulated in a housing 11 which is filled with a gaseous or liquid dielectric. In order to produce microwaves, a high-voltage generator 12, for example a generator which operates on the basis of the principle of a Marx surge-voltage circuit, produces a voltage which, in the illustrated example, is applied to the electrode 7. The two electrodes 6, 7 form a capacitor structure which can be charged via the high-voltage source 12. When the charging voltage on the electrode 7 reaches the breakdown voltage of the spark gap 8, this results in the ignition of an arc, that is to say in a short circuit between the two electrodes 6, 7, as a result of which radio-frequency discharge currents oscillate in the electrodes 6, 7, thus resulting in a resonant response, and also in the emission of high-energy microwaves via the two electrodes 6, 7, which act as antenna electrodes. The capacitance of the capacitor arrangement comprising the two electrodes 6, 7 is governed essentially by the dielectric 14 which is located in the electrode intermediate space 13. The illustrated exemplary embodiment is based on the assumption that the first dielectric 14 is a gaseous dielectric, for example $SF_6$.

In order now to provide the capability to vary the resonant behavior and at the same time the frequency of the emitted microwaves, it is possible in the case of the microwave generator 1 according to the invention to replace the first dielectric 14 by a second dielectric 15 with a different dielectric constant. By way of example, the second dielectric is assumed to be water, with a high dielectric constant of $\in_r = 80$. During pulsed operation, water has a very high withstand voltage. If water is arranged in the electrode intermediate space 13, then the capacitance is changed and, if it is filled completely, this results in the maximum capacitance and thus the minimum resonant frequency of the antenna structure, comprising the electrodes 6, 7 in comparison to the minimum capacity when the electrode intermediate space 13 is completely filled with gas, with this being associated with the highest resonant frequency, with the dielectric constant of gases being $\epsilon_r \approx 1$.

In order to fill the electric intermediate space 13 with a different dielectric 15, specifically with the second dielectric 15, the electrode intermediate space is clad on the outside with a flexible membrane 16, preferably a rubber membrane which is in the form of a ring or collar and closes the coaxial electrode arrangement off from the housing 2. A connecting line 18 leads from the reservoir 17, in which the second dielectric is stored, through the antenna housing 2 behind the membrane 16. The reservoir 17 is itself closed in a sealed manner on one side by the electrode 6, and on the other side by a further flexible membrane 19.

An opening 20 is provided in the area of the electrode 7 for extraction or supply of the first dielectric, which is located in the electrode intermediate space 13, to which opening 20, in the illustrated exemplary embodiment, a pump device P is connected, whose operation is controlled by a control device 21, and which is connected, for example, to a reservoir 22 for the first dielectric 14.

Figure 2:
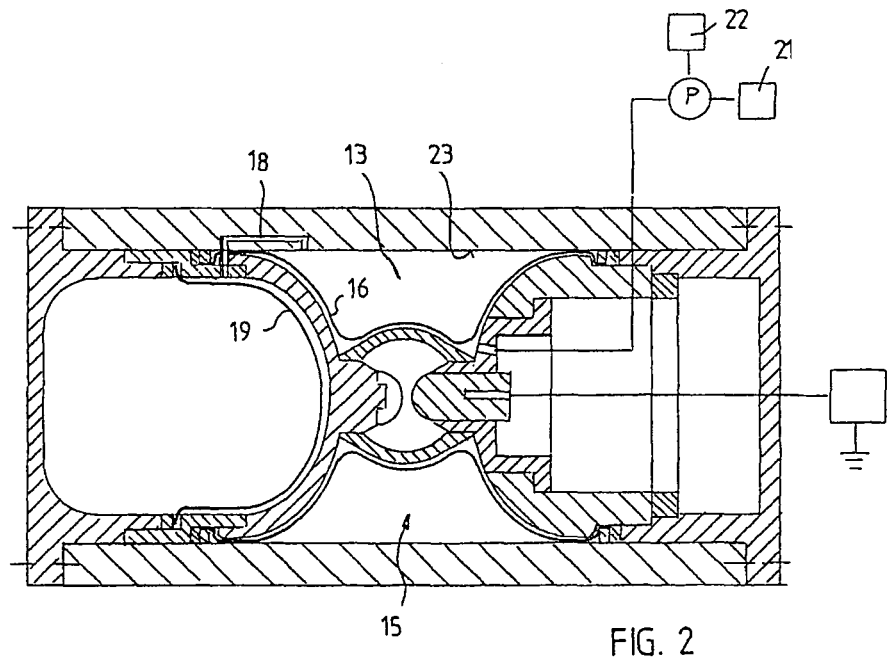
FIG. 2 shows the microwave generator from FIG. 1, after replacement of the dielectric.

If it is now intended to replace the dielectric, the first dielectric 14 is sucked out and is fed into the reservoir 22 via the pump device P (which may be any desired pump). This results in a reduced pressure in the electrode intermediate space, which sucks the flexible membrane 16 inwards. This takes place uniformly over the circumference of the electrode intermediate space 13, because the design is rotationally symmetrical. At the same time, as the membrane 16 is drawn inwards, this results in a reduced pressure towards the reservoir 17, and this leads to the second dielectric 15 being sucked out via the connecting line 18 and being distributed circumferentially homogenously in the intermediate space between the membrane 16 and the inner surface 23 of the housing 2. While FIG. 1 shows the state in which the electrode area 13 between the electrodes 6, 7, which form a dipole, is completely filled with the first dielectric 14, FIG. 2 shows the situation in which the first dielectric 14 has been pumped out approximately completely, and the electrode intermediate space 13 is approximately completely filled with the second dielectric 15 (provided that cladding is possible in the area for encapsulation of the housing 11 over the membrane 16). As can be seen, the further membrane 19 is drawn into contact with the electrode 6. In this case, the volume of the reservoir 17 corresponds essentially to, the volume of the electrode intermediate space 13.

If it is now intended to resume the initial state, then the first dielectric 14 would be forced back via the pump device P from the reservoir 22 into the electrode intermediate space under the membrane 16, which leads to this being forced back to its initial position, and in the second dielectric 15 being fed back into the reservoir 17 via the connecting line 18 (of which, of course, it is possible to provide a plurality distributed over the circumference) until the state illustrated in FIG. 1 is resumed. In this case, in principle, it is possible to set any desired intermediate filling level between the end states shown in FIGS. 1 and 2.

As a consequence of the change in the dielectric located in the electrode intermediate space, this always results in a different "overall dielectric constant", depending on the filling level with one dielectric or the other, and this governs the capacitance of the resonator structure 5. Furthermore, as described, this makes it possible to select or tune the resonance behavior and also the frequency spectrum of the emitted high-power microwave pulses.

Figure 3:
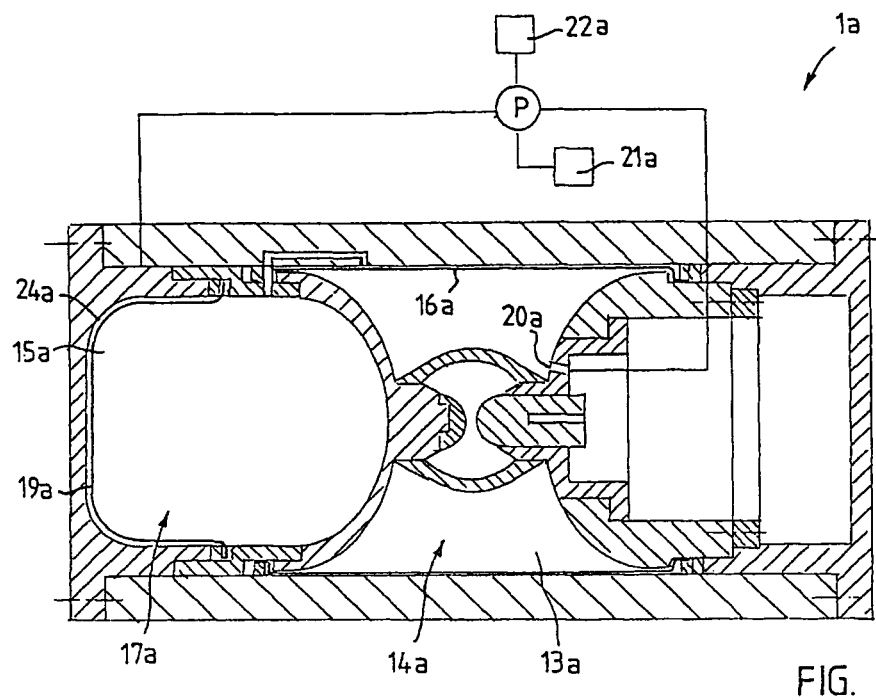
FIG. 3 shows an outline illustration of a second embodiment of a microwave generator according to the invention.

FIG. 3 shows a further embodiment of a microwave generator 1a according to the invention, whose design corresponds to the microwave generator 1 shown in FIGS. 1 and 2. However, in this case, the pump device P is connected not only to the opening 20a for suction of the first dielectric 14a which is located in the electrode intermediate space 13a, but also via a supply line to the housing area 24a which is located behind the membrane 19a of the reservoir 17a. When the pump is operated for suction of the first dielectric 14a, corresponding first dielectric 14a is at the same time, for example, forced into the housing area 24a from the reservoir 22. This results in it being actively extracted on one side, with a reduced pressure being produced, while the second dielectric 15a is actively forced out of the reservoir 17a on the other side.

Figure 4:
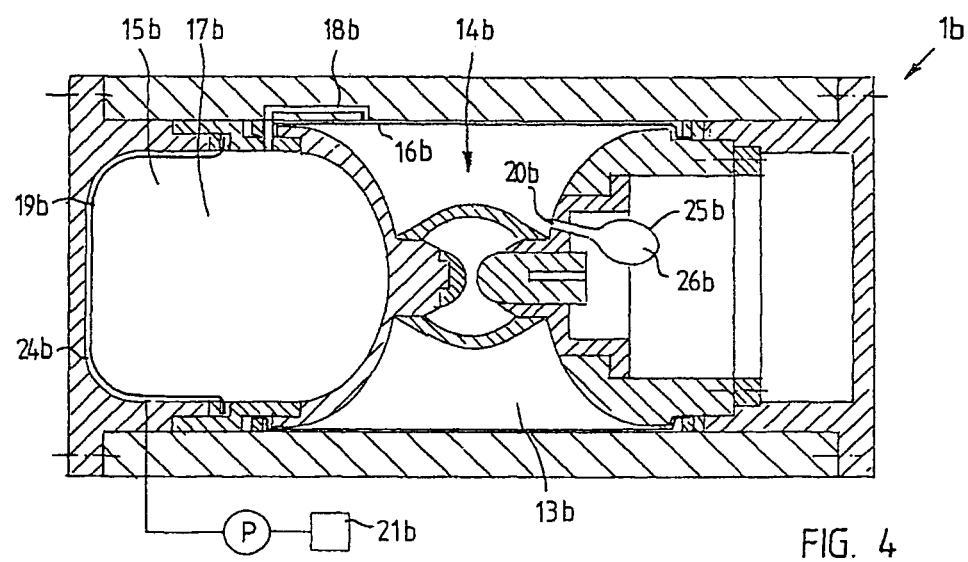
FIG. 4 shows an outline illustration of a third embodiment of a microwave generator according to the invention.

Finally, FIG. 4 shows a third embodiment of a microwave generator 1b according to the invention, whose design corresponds to that of the microwave generator 1 shown in FIG. 1. In this case, the pump device P communicates exclusively with the housing area 24b which is located behind the reservoir 17b and thus behind the further flexible membrane 19b. If the first dielectric 14b located in the electrode intermediate space 13b is now intended to be replaced, a gas, for example, is forced via the pump into the housing area 24b, so that the second dielectric 14b is forced out of the reservoir 17b via the connecting line 18b behind the membrane 16b, so that it bulges in the electrode intermediate space 13b. In this case as well, a control device 21b is provided, which controls pump operation, in the same way as the control device 21a in the embodiment of the microwave generator 1a as well.

The first dielectric 14b which is forced out of the electrode intermediate space 13b is held in a reservoir 26b, which for example is likewise formed above a flexible membrane 25b. In this case, the membrane 25b stretches in a similar manner to a balloon. If the aim is to resume the state shown in FIG. 4, the housing area 24b is evacuated via the pump device P, so that the membrane 19b is sucked outwards again, and the second dielectric 15b is sucked back at the same time. The first dielectric 14b is fed into the electrode intermediate space 13b, assisted by the relaxation of the stretched membrane 25b.

At this point, it should be noted that the respective control device 21, 21a or 21b may be designed such that the respective electrode intermediate space is filled during the operation of the respective microwave generator 1, 1a, 1b, that is to say with frequency tuning also being carried out during operation. It is also feasible to select a nominal frequency or a nominal frequency spectrum on the respective control device, with the filling being regulated on this basis, that is to say the actual frequency spectrum is measured continuously and is compared with the nominal frequency spectrum, and the dielectric constant is varied by filling of the electrode intermediate space until the actual spectrum corresponds to the nominal spectrum.

The invention claimed is:

1. A microwave generator, comprising a housing having two mutually opposite electrodes which are separated via an electrode intermediate space which is filled with a first dielectric, said electrodes having a spark gap therebetween, which breaks down in order to emit microwaves upon the application of a high voltage, wherein the electrode intermediate space (13, 13a, 13b) is at least partially filled with a second dielectric (15, 15a, 15b) which has a different dielectric constant in comparison with that of the first dielectric (14, 14a, 14b) which is located between the electrodes (6, 7) in order to vary the microwave frequency, said second dielectric (15, 15a, 15b) being retained in a first reservoir (17, 17a, 17b) which communicates with the electrode intermediate space (13, 13a, 13b).

2. The microwave generator as claimed in claim 1, wherein a further reservoir (22, 22a, 25) is provided for the first dielectric (14, 14a, 14b), so that the first and the second dielectrics (14, 14a, 14b, 15, 15a, 15b) are reversibly feedable into the electrode intermediate space (13, 13a, 13b).

3. The microwave generator as claimed in claim 1, wherein the electrodes (6, 7) are constituted of similar spherical caps and are connected to the housing (2) at an edge which bounds the electrode intermediate space (13, 13a, 13b).

4. The microwave generator as claimed in claim 1, wherein there is provided a flexible stretchable membrane (16, 16a, 16b), which bounds the electrode intermediate space (13, 13a, 13b) towards the housing (2) and which membrane stretches into the electrode intermediate space (13, 13a, 13b) upon an application of pressure.

5. The microwave generator as claimed in claim 4, wherein the membrane (16, 16a, 16b) extends in an annular shape along an inner wall of the housing and, upon pressure being applied, is stretched uniformly into the electrode intermediate space (13, 13a, 13b) towards the spark gap (8) which is arranged encapsulated and centrally arranged.

6. The microwave generator as claimed in claim 1, wherein at least one opening (20, 20a, 20b) is provided on one said electrode (7) for a selective extraction and appropriate supply of the first dielectric (14, 14a, 14b).

7. The microwave generator as claimed in claim 1, wherein the reservoir (17, 17a, 17b) for the second dielectric (15, 15a15b) is provided immediately behind one of the electrodes (6) and is bounded thereby.

8. The microwave generator as claimed in claim 7, wherein there is provided a further movable and flexible membrane (19, 19a, 19b) which bounds the first reservoir (17, 17a, 17b).

9. The microwave generator as claimed in claim 8, wherein the membranes (16, 16a, 16b, 19, 19a, 19b) are each selectively composed of plastic or rubber.

10. The microwave generator as claimed in claim 1, wherein the second dielectric (15, 15a) is feedable into the electrode intermediate space (13, 13a) by producing a reduced pressure in the electrode intermediate space (13, 13a), through an extraction of the first dielectric (14, 14a) by a pump device (P).

11. The microwave generator as claimed in claim 10, wherein the second dielectric (15b) is feedable into the electrode intermediate space (13b) by producing a pressure, which acts on the reservoir (17b), such as through a flexible membrane (19b) by the pump device (P).

12. The microwave generator as claimed in claim 10, wherein the pump device (P) is used for suctioning and for the application of pressure at the same time to the membrane (19a) which bounds the reservoir (17a).

13. The microwave generator as claimed in claim 12, wherein the first dielectric (14a), which is pumped by the pump device (P), is used for an application of pressure.

14. The microwave generator as claimed in claim 1, wherein the second dielectric (15, 15a, 15b) is fed into the electrode intermediate space (13, 13a, 13b) while microwaves are being produced.

15. The microwave generator as claimed in claim 14, wherein the supply of the second dielectric (15, 15a, 15b) is controlled as a function of a comparison of a nominal microwave frequency with an actual microwave frequency which is measured continuously while said microwaves are being produced.

* * * * *